United States Patent [19]

Chang

[11] Patent Number: 5,172,194

[45] Date of Patent: Dec. 15, 1992

[54] STRUCTURES OF MODULATION DOPED BASE HOT ELECTRON TRANSISTORS

[75] Inventor: Chun-Yen Chang, Taiwan, Taiwan

[73] Assignee: National Science Council, Taiwan

[21] Appl. No.: 489,354

[22] Filed: Mar. 6, 1990

Related U.S. Application Data

[63] Continuation-in-part of Ser. No. 97,043, Sep. 16, 1987, abandoned.

[51] Int. Cl.[5] .......................................... H01L 29/161
[52] U.S. Cl. ...................................... 257/26; 257/191; 257/195
[58] Field of Search ................... 357/4, 16, 34, 34 HB, 357/56, 90, 22 A, 22 MD

[56] References Cited

U.S. PATENT DOCUMENTS

| | | | |
|---|---|---|---|
| 4,758,868 | 7/1988 | Frijlink | 357/34 X |
| 4,835,581 | 5/1989 | Kuroda et al. | 357/16 |
| 4,878,095 | 10/1989 | Bending et al. | 357/16 |
| 4,926,232 | 5/1990 | Ando et al. | 357/34 |

FOREIGN PATENT DOCUMENTS 61-39576 2/1986 Japan .............................. 357/34 HB

OTHER PUBLICATIONS

Hayes et al., "Hot-Electron Transport in a Graded Band-Gap Base Heterojunction Bipolar Transistor," *Appl. Phys. Lett.* 53(6), Aug. 8, 1988, pp. 490-492.
No Author, "Graded Barrier in Tunnelling Hot Electron Transfer Amplifiers", *IBM Technical Disclosure Bulletin*, vol. 31, No. 8, Jan. 1989, p. 345.

*Primary Examiner*—William Mintel
*Attorney, Agent, or Firm*—Lalos & Keegan

[57] ABSTRACT

A three-terminal hot-electron device, in particular a two dimensional electron gas base transistor which can be fabricated by molecular beam epitaxy (MBE). The two-dimensional electron gas is induced in an undoped GaAs quantum well by a modulation doping is used as the base of the transistor and permits a common-base current gain α to be achieved as high as 0.96 under a collector bias of 2.5 V and an emitter current of 3 mA.

12 Claims, 2 Drawing Sheets

STRUCTURES OF MODULATION DOPED BASE HOT ELECTRON TRANSISTORS

This application is a continuation-in-part of U.S. application Ser. No. 097,043, filed Sept. 16, 1987, now abandoned.

BACKGROUND OF THE INVENTION

MOSFET's and BJT's (Bipolar Junction Transistor) are most widely used in VLSI (Very Large Scale Integration) Circuits on silicon bases. On the other hand, MOSFET is largely used in GaAs based circuits. Recently high speed devices such as HEMT (High Electron Mobility Transistor), HBT (Heterojunction Bipolar Transistor) etc. have been intensively explored.

High speed operation, which is achievable by using some new concept, such as high electron mobility which leads to a high carrier drift velocity, and high conductance, hence very small RC delay time, can be obtained within pico-seconds.

Applying the property of high carrier mobility of a 2DEG (two dimensional electron (or hole) gas) system to hot electron transistors was first demonstrated by the present invention (Applied Physics Letters 46 (11), p. 1086, 1985). A hot electron transistor in which 2DEG (two dimensional electron gas) can be produced in the base by applying an electric displacement due to a collector to base reverse bias was proposed by S. Luryi (IEEE-EDL6, p. 178, 1985), which is called "Induced Base Transistor". It was realized by Chang et al. in 1986 (IEEE-EDL7(a), p. 497, 1986). In the present invention, based on the former concept of 2DEG in the base, a hot electron transistor is proposed, in which the 2DEG base is produced by modulation doping instead of electric (field) displacement.

SUMMARY OF THE INVENTION

The present invention is a hot electron transistor which consists of an emitter (E), a base (B) and a collector (C). There is either a triangular or rectangular potential barrier between the emitter and the base as well as or alternatively between the collector and the base.

The electron well potential energy barrier diagram is depicted in FIG. 1(a), (b), (c), (d). The potential barrier can be formed either by molecular beam epitaxy (MBE) or metal-organic chemical vapor deposition (MOCVD) of compound semiconductor materials such as GaAs/AlGaAs.

A two dimensional carrier (electron) gas is formed in the base region due to a modulation doping of n-type material such as Si in an AlGaAs barrier region. Both the terminal layers of the emitter or the collector are of heavily n-type doped GaAs. The modulation doping layer is a thin layer of n+ doping (say 100Å with a doping level of $10^{18}$ cm$^{-3}$) in the undoped AlGaAs barrier regions.

Variations of these structures are also feasible such as the triangular emitter-rectangular collector barrier type or vice versa. There is a separation "s" between the modulation doping layer and the 2DEG to reduce the coulombic scatterings, in all figures from (a) through (d).

DETAILED DESCRIPTION

Figure 1A:
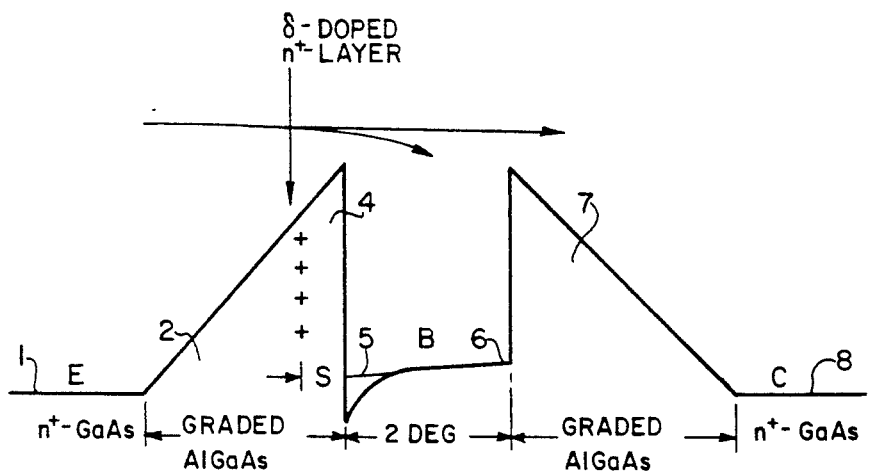
FIG. 1(a) illustrates the formation of the triangular barrier type transistor with a modulation doping in the undoped AlGaAs emitter region in which the collector terminal layer is a heavily doped GaAs (1), then are consecutively grown (MBE or MOCVD) conductive layers of undoped graded x of the $Al_xGa_{1-x}As$ layer (3), the S-doped n+ AlGaAs layer (6a), again a continuation of the undoped continuously graded x $Al_xGa_{1-x}As$ layer (3), the undoped GaAs base layer (4) in which a 2DEG is formed in the proximity of base layer 4, then the then undoped continuously graded x $Al_xGa_{1-x}As$ layers (5 and 7) and finally the n+—GaAs emitter terminal layer (8).
Figure 1B:
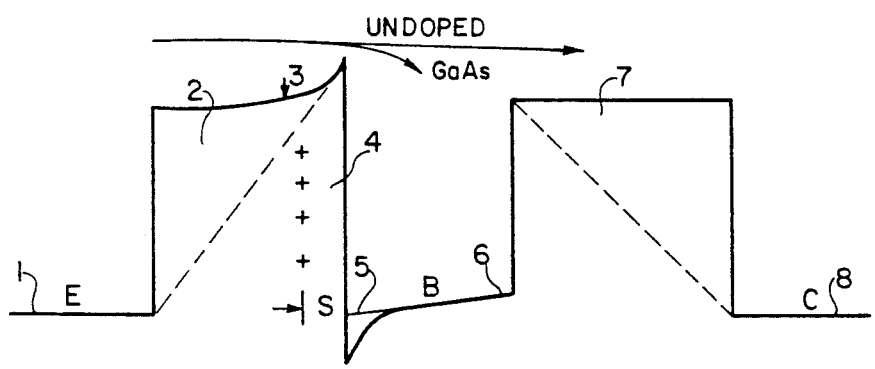
FIG. 1(b) illustrates formation of the rectangular barrier type transistor wherein the dotted line illustrates the triangular barrier type, which is the same one shown in FIG. 1(a)
Figure 1C:
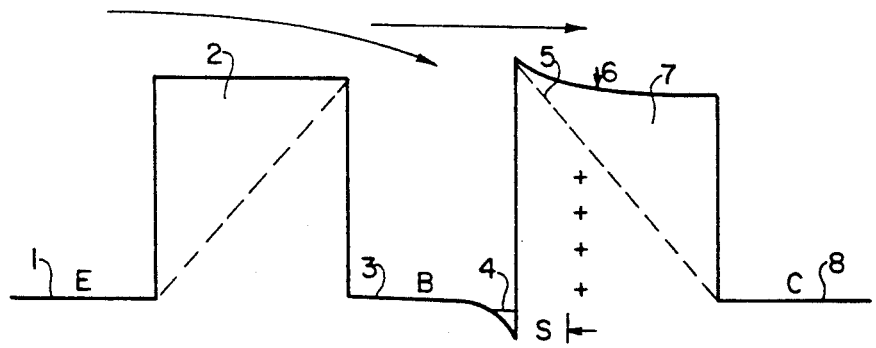
FIG. 1(c) illustrates the rectangular barrier (solid line) and the triangular barrier (dotted line) but the modulation doping layer is in the collector undoped region (7).
Figure 1D:
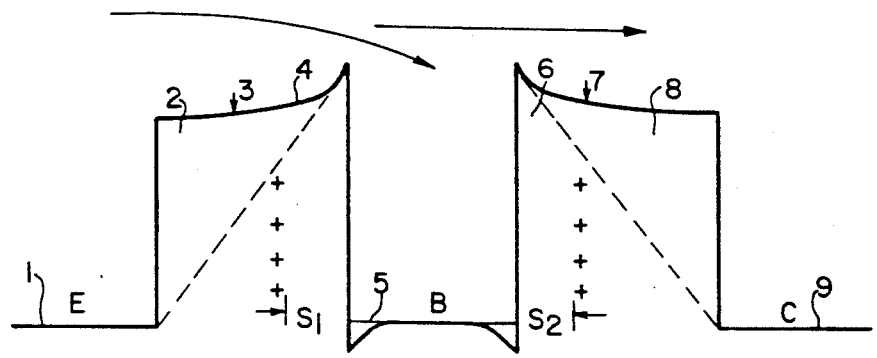
FIG. 1(d) illustrates that both in the collector and emitter undoped barrier region there is modulation doping layer respectively (3 and 7).
Figure 2:
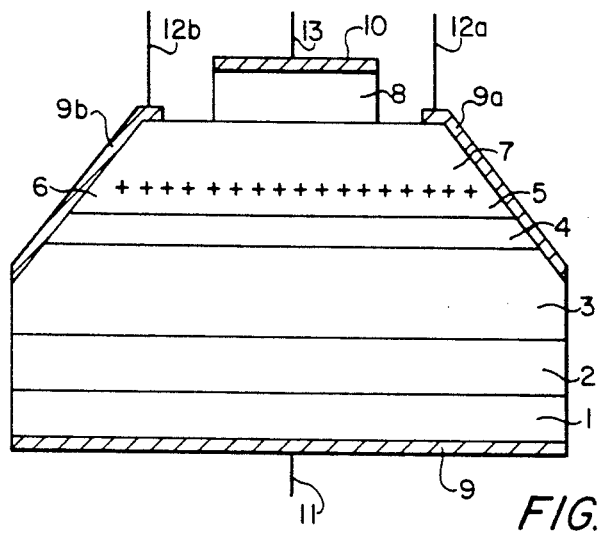
FIG. 2 illustrates the structure of a hot electron transistor.

The present invention was grown by the molecular beam epitaxy technique (MBE for short), the V-grooved TEG- base transistor (TEG BT) which is a majority carrier transport device with a modulation of the barrier directly by the $V_{EB}$ bias. By using a two dimensional electron gas as the base, the structure is n+GaAs/n+GaAs (buffer)/graded i-AlGaAs/thin n$^{30}$-GaAlGaAs/continuously graded i-AlGaAs/i-GaAs(-2DEG-Base)/i-AlGaAs/n+GaAs. An i designates undoped n intrinsic, and the thin n+-AlGaAs is for modulation doping. A cross section of this device is schematically shown in FIG. 2.

The typical structure investigated consists of a n+-GaAs Substrate (1), a 1.0 μm n+GaAs buffer layer (2), a 0.18 μm undoped $Al_{0.4}Ga_{0.6}As$ collector barrier (3), a 100A undoped GaAs quantum well base (4), a 0.15 μm undoped $Al_xGa_{1-x}As$ graded barrier (x=0.4→0) (5), in which a 100Å thin n+—AlGaAs modulation doping layer is imbedded (6) with a 100Å AlGaAs undoped spaces (5) lie between layers 4 and 6 and a 0.3 μm n+GaAs cap layer (8).

The 2DEG-Base Transistor has three terminals, the collector contact (9), the emitter contact (10), and the base contacts (9a, 9b). Three package leads, collector leads (11), emitter leads (13), and base leads (12a) (12b). A difference from other hot-electron transistors is that the base of this transistor can be fabricated as thin as 100Å or smaller without a loss in its sheet conductance. The 2DEG is in the undoped GaAs quantum well (∼100Å). In order to make a contact to the base layer easily, the Emitter and base regions were delineated by a selective etching technique. A mesa structure was then formed along the emitter periphery by the V-grooved etch technique with the etching solution of $H_2SO_4 : H_2O_2:H_2O$ (1:8:10).

Figure 3:
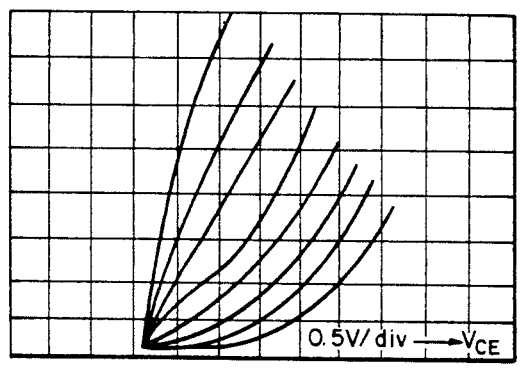
FIG. 3 illustrates common base current-voltage characteristics of the transistor.

The common base current-voltage characteristics are as shown in FIG. 3. Due to the low fraction of electron loss in transporting the base and low probability of quantum mechanical refection when electrons are passing over the triangular barrier, the common base current gain, $\alpha \approx 0.96$ ($V_{CE}=2.5$ V, $IE_{=3mA}$) has been achieved. It is much higher than the reported metal-base transistors, e.g., the Si/CoSi$_2$/Si structure MBT with $\alpha \leq 0.2$.

The transit delay time in the collector is $\tau = d_2/V_S$, where $V_S$ is the saturation velocity. In this device $\tau$, is about 1ps. However, at room temperature the device is mainly limited by the $R_b C_{eb}$ constant. This becomes negligible when operated at very low temperature (e.g., 4°K). Moreover, a velocity overshoot may be prevailed in such a thin layer of base and collector when it is comparable to the electron scattering mean free path.

Figure 4:
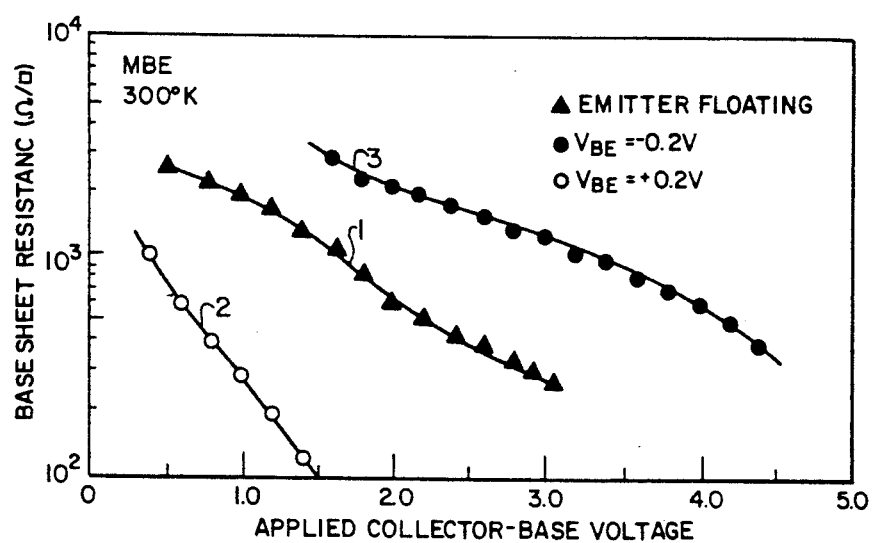
FIG. 4 shows the base sheet resistances vs. applied collector base voltage characteristics of the transistor.

The relationship between the 2DEG base sheet resistance, $R_\square$, and the applied collector-base voltage, $V_{CB}$, is illustrated in FIG. 4. When the emitter is floating and $V_{CB} < 0.5$ V, $R_\square$ is very large due to the subthreshold regime. As $V_{CB} > 0.5$ V, $R_\square$ decreases with increasing the $V_{CB}$, on account of the increasing of induced 2DEG density in the base as discussed with respect to FIG. 1. The induced 2DEG is limited by the breakdown field in the AlGaAs barrier. The $\Omega/\square$ versus $V_{CB}$ curve is shown in curve (1) of FIG. 4. If a negative base-emitter bias, $V_{EB}$, is applied, the barrier height of the triangular emitter barrier is reduced, which enhances the carrier injection from emitter to base, and the base sheet resistance is reduced. The $\Omega/\square$ versus $V_{CB}$ curve is shown in curve (2) of FIG. 4. When the polarity of the $V_{EB}$ is changed, the base sheet resistance is increased due to the reduction of the base 2DEG density. The $\Omega/\square$ versus $V_{CB}$ curve is shown in curve (3) of FIG. 4.

In conclusion, a novel hot-electron transistor with 2DEG base has been fabricated successfully. The ultra-thin base is made by using an undoped GaAs quantum well. A V-groove etch technique is used to make contact to the base layer. The main attractive feature of metal-base transistor, high speed operation, and high common-base current gain, $\alpha(\approx 0.96)$ have been obtained, simultaneously. Charges in the quantum well base are formed due to electron spill out from the thin modulation doping layer to the base.

I claim:

1. A hot electron transistor, comprising:
   a first conductive n+ - GaAs substrate layer;
   a second conductive n-GaAs buffer layer on said first conductive n+ - GaAs layer;
   a first undoped continuously graded Al$_x$Ga$_{1-x}$As layer on said second conductive n-GaAs buffer layer, in which x decreases to zero in a direction toward said second conductive n-GaAs buffer layer;
   an undoped GaAs base layer on said undoped graded Al$_x$Ga$_{1-x}$As layer;
   a second undoped continuously graded Al$_y$Ga$_{1-y}$As layer on said undoped GaAs layer, in which y decreases to zero in a direction away from said undoped GaAs base layer, one of said undoped continuously graded layers being doped with an n-type material in a layer portion proximate to said undoped GaAs base layer, thereby forming a modulation doped layer which generates a two dimensional electron gas in said undoped GaAs base layer; and
   a doped n+-GaAs cap layer.

2. A transistor as in claim 1, wherein at least one of said first and second undoped graded layers are doped with an n-type material in a layer proximate to said undoped GaAs base layer.

3. A transistor as in claim 1, further comprising collector and emitter terminal leads respectively connected to said first conductive n+ - GaAs substrate layer and said doped n+-GaAs cap layer.

4. A transistor as in claim 1, further comprising collector, base and emitter terminal leads respectively connected to said first conductive n+ - GaAs substrate layer, said undoped GaAs base layer and said doped n+-GaAs cap layer.

5. A hot electron transistor, comprising:
   a first conductive n+ - GaAs substrate layer;
   a second conductive n type GaAs buffer layer on said first conductive n+ - GaAs layer;
   a first undoped Al$_z$Ga$_{1-z}$As layer on said second conductive n type GaAs buffer layer, in which z is one of constant and decreasing to zero in a direction toward said second conductive n-GaAs buffer layer;
   an undoped GaAs base layer on said undoped graded Al$_z$Ga$_{1-z}$As layer;
   a second undoped Al$_y$Ga$_{1-y}$As layer on said undoped GaAs layer, in which y is one of constant and decreasing to zero in a direction away from said undoped GaAs base layer, one of said undoped layers being doped with an n-type material in a layer proximate to said undoped GaAs base layer, thereby forming a modulation doped layer which generates a two-dimensional electron gas in said undoped GaAs base layer: and
   a doped n+-GaAs cap layer.

6. A transistor as claimed in 1, wherein a doped GaAs layer is imbedded in at least one of the undoped AlGaAs layers.

7. A transistor as in claim 3, wherein the modulation doped layer in the undoped AlGaAs layers reduces the doping impurity scattering and increases the doping concentration compared to the conventional modulation doped AlGaAs layer.

8. The transistor as in claim 7 wherein at least one of said first and second undoped graded layers are imbedded with a doped n-type GaAs layer proximate to said undoped GaAs.

9. A transistor as in claim 6, further comprising collector and emitter terminal leads respectively connected to said first conductive n+ - GaAs substrate layer and said doped n+-GaAs cap layer.

10. A transistor as in claim 6, further comprising collector, base and emitter terminal leads respectively connected to said first conductive n+ GaAs substrate layer, said undoped GaAs base layer and said doped n+-GaAs cap layer.

11. A hot electron transistor, as claimed in claim 1, with a graded x and a constant y in the AlGaAs layers.

12. A transistor as claimed in claim 1, wherein the GaAs can be replaced by other lower band gap semiconductors, while the AlGaAs can be replaced by other higher band gap semiconductor materials.

* * * * *